US007190456B2

United States Patent
Yamamoto

(10) Patent No.: US 7,190,456 B2
(45) Date of Patent: Mar. 13, 2007

(54) ALIGNMENT METHOD, ALIGNMENT APPARATUS, EXPOSURE APPARATUS USING THE SAME, AND DEVICE MANUFACTURED BY USING THE SAME

(75) Inventor: Takeshi Yamamoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/304,813

(22) Filed: Dec. 16, 2005

(65) Prior Publication Data

US 2006/0095227 A1 May 4, 2006

Related U.S. Application Data

(62) Division of application No. 10/290,495, filed on Nov. 8, 2002, now Pat. No. 7,006,226.

(30) Foreign Application Priority Data

Nov. 15, 2001 (JP) ............................. 2001-350106

(51) Int. Cl.
*G01B 11/00* (2006.01)
*G03F 9/00* (2006.01)
*G03B 27/42* (2006.01)
*G01N 21/86* (2006.01)

(52) U.S. Cl. ..................... 356/401; 430/22; 355/53; 250/548

(58) Field of Classification Search .................... None
See application file for complete search history.

(56) References Cited

U.S. PATENT DOCUMENTS

| 5,153,678 | A | * | 10/1992 | Ota ............................ 356/401 |
| 5,805,866 | A | | 9/1998 | Magome et al. ............. 395/500 |
| 6,481,003 | B1 | | 11/2002 | Maeda ........................ 716/21 |
| 6,984,838 | B2 | * | 1/2006 | Kosugi .................... 250/559.3 |
| 6,992,767 | B2 | * | 1/2006 | Matsumoto et al. ........ 356/401 |

* cited by examiner

*Primary Examiner*—Gregory J. Toatley, Jr.
*Assistant Examiner*—Gordon J. Stock, Jr.
(74) *Attorney, Agent, or Firm*—Fitzpatrick, Cella, Harper & Scinto

(57) ABSTRACT

An apparatus for determining positions of a plurality of regions formed on a substrate based on positions of a plurality of sample regions sampled from the plurality of regions. The apparatus includes a processor configured to control operation of a stage and an alignment optical system so as to obtain positions of the plurality of the sample regions sampled from the plurality of regions, to calculate a first conversion parameter and a second conversion parameter for converting designed positions of the plurality of regions into first and second determined positions of the plurality of regions based on at least designed positions of the plurality of the sample regions and positions of the plurality of the sample regions measured by the alignment optical system, and to determine whether to finish the position determinations based on a difference between the first conversion parameter and the second conversion parameter.

8 Claims, 9 Drawing Sheets

ALIGNMENT METHOD, ALIGNMENT APPARATUS, EXPOSURE APPARATUS USING THE SAME, AND DEVICE MANUFACTURED BY USING THE SAME

This application is a divisional application of U.S. patent application Ser. No. 10/290,495, filed Nov. 8, 2002, now U.S. Pat. No. 7,006,226 issued on Feb. 28, 2006.

BACKGROUND OF THE INVENTION

1. Field of the Invention

The present invention relates to an alignment method and an alignment apparatus used in an apparatus which requires a precision alignment unit, for example, an exposure apparatus in which an electronic circuit pattern on an original plate such as a mask is exposed onto a substrate such as a semiconductor wafer. The alignment method and the alignment apparatus are used for accurately aligning a plurality of alignment targets formed on the substrate in a predetermined configuration with high accuracy. In addition, the present invention also relates to an exposure apparatus using the alignment method and the alignment apparatus.

2. Description of the Related Art

In semiconductor exposure apparatuses, so-called steppers are commonly used for aligning a mask and a wafer with high accuracy.

FIG. 4 is a schematic diagram showing a known semiconductor exposure apparatus. As shown in FIG. 4, exposure light 9 is irradiated onto a wafer 7 placed on an XY stage 8, which moves along a two-dimensional plane, and an electronic circuit pattern formed on a mask 6 is thereby transferred onto the wafer 7.

With reference to FIG. 4, reference numeral 1 denotes an illumination device used for alignment, reference numeral 2 denotes an imaging device, and reference numeral 3 denotes a position detector. An alignment optical system is constructed of these components, and serves to detect a relative displacement between the mask 6 and the wafer 7. Reference numeral 4 denotes a central processing unit (CPU), and reference numeral 5 denotes a stage driver for driving the XY stage 8.

As shown in FIG. 5, alignment marks (M1x, M1y, M2x, M2y, . . . ), each of which is detectable in the X or Y direction, are formed on the wafer 7 at shot areas where exposure is to be performed. In addition, the mask 6 has marks corresponding to the alignment marks formed on the wafer 7, and the relative displacement between the mask 6 and the wafer 7 is detected by the above-described alignment optical system.

FIG. 6 is a flowchart showing an exposure process performed by the semiconductor exposure apparatus shown in FIG. 4.

As shown in FIG. 6, first, the wafer 7 is placed on the XY stage 8 by a wafer-conveying device (not shown) (Step 601). Then, the CPU 4 shown in FIG. 4 sequentially selects the alignment marks formed at each of the shot areas on the wafer 7 (Step 602), moves the XY stage 8 such that the selected alignment marks are moved to be below the marks formed on the mask 6 (Step 603), and measures the amount of displacement at each of the shot areas (Step 604). Steps 602 to 604 are repeated until the number of shots reaches a predetermined number (Step 605). In FIG. 6, the number of sample shots is set to eight.

FIG. 7 is a diagram showing a designed mark position di, an actual mark position ai, a corrected mark position gi obtained by using conversion parameters, and the residual error ei between the corrected mark position gi and the actual mark position ai, in a shot area of the wafer 7 used in the semiconductor exposure apparatus shown in FIG. 4 and in an exposure apparatus according to an embodiment of the present invention, which will be described below. With reference to FIG. 7, when the actual mark position ai=[axi, ayi] at each of the shot areas, which is obtained by measurement, is derived from the designed mark position di=[dxi, dyi] by correction conversion, the corrected mark position gi=[gxi, gyi] including the residual error ei=[exi, eyi] is expressed as follows:

$$gi = Adi + S \qquad (1),$$

wherein A and S are conversion parameters, which will be discussed in more detail below.

In addition, the residual error is expressed as follows:

$$ei = ai - gi \qquad (2)$$

At Step 606 in FIG. 6, the CPU 4 shown in FIG. 4 determines the conversion parameters A and S so as to minimize the sum of squares of the residual error ($\Sigma |ei|^2$) determined by equation (2).

Then, the CPU 4 shown in FIG. 4 drives the XY stage 8 on the basis of the determined conversion parameters A and S, and exposure is performed for all of the shot areas on the wafer 7 (Step 607). Lastly, the wafer 7 is unloaded (Step 608).

The conversion parameters A and S in equation (1) can be expressed as follows:

$$A = \begin{pmatrix} 1+\alpha x & 0 \\ 0 & 1+\alpha y \end{pmatrix} \begin{pmatrix} \cos\theta y & \sin\theta y \\ -\sin\theta x & \cos\theta x \end{pmatrix}, S = \begin{pmatrix} Sx \\ Sy \end{pmatrix} \qquad (3)$$

In equations (3), $\alpha x$ and $\alpha y$ show expansions of the wafer in the X and Y directions, respectively, and $\theta x$ and $\theta y$ show rotations around the X and Y axes, respectively, of the shot-area configuration. In addition, S shows parallel displacements of the wafer in the X and Y directions.

In this method, the displacement measurement need not be performed at all of the shot areas, but rather, it is only performed at a limited number of shots areas (sample shots). Accordingly, there is an advantage in that the throughput increases.

However, since the number of sample shots is set in advance in the above-described known technique, when a wafer having a large configuration error is used, correction error increases due to an insufficient number of the sample shots. In addition, when a wafer having a small configuration error is used, the number of sample shots is larger than that necessary for obtaining the required accuracy. In such a case, there is a disadvantage in that the throughput decreases.

FIGS. 8 and 9 show the relationship between the number of shots and the conversion parameter according to the known art. The vertical axis shows the conversion parameter and the horizontal axis shows the number of shots. In both of the examples shown in FIGS. 8 and 9, the number of sample shots is set to eight. In FIG. 8, the measurement is finished even though the conversion parameter has not yet converged sufficiently. In such a case, the alignment accuracy decreases. On the other hand, in FIG. 9, the measurement is unnecessarily continued even after the conversion parameter has converged and a sufficiently accurate conversion parameter is obtained.

SUMMARY OF THE INVENTION

An object of the present invention is to provide an alignment method and an alignment apparatus in which alignment is performed with high accuracy without reducing the throughput in accordance with the configuration accuracy of the marks to be measured, which are formed on a substrate. In addition, another object of the present invention is to provide an exposure apparatus using the alignment method and the alignment apparatus.

In order to attain the above-described objects, according to one aspect of the present invention, in an alignment method for sequentially aligning a plurality of alignment targets formed on a substrate, in a predetermined configuration, to a predetermined reference position, the positions of a plurality of sample targets selected from the alignment targets are sequentially measured, and conversion parameters which represent an amount of position correction required for each of the sample targets are calculated so as to minimize an overall error between the measured positions and designed positions of the sample targets. Then, one or more sample targets are additionally selected from the alignment targets and the positions of the selected sample targets are measured. Then, conversion parameters which represent an amount of position correction for each of the sample targets are calculated so as to minimize an overall error between the measured positions and the designed positions of the sample targets, and it is determined whether or not to finish the alignment measurement on the basis of a plurality of sets of conversion parameters.

According to another aspect of the present invention, in an alignment method for sequentially aligning a plurality of sample shot areas formed on a substrate to a predetermined reference position, conversion parameters between the measured values and designed values are calculated so as to minimize alignment correction residual errors at the sample shot areas whose positions have already been measured while the number of sample shots is increased, and the number of sample shots is determined on the basis of the conversion parameters.

According to the present invention, the conversion parameters can be determined with the same accuracy for both a substrate having a large measurement error and a substrate having a small measurement error. Therefore, the alignment accuracy can be improved. In addition, in a case in which a substrate having a small measurement error is used, the number of alignment targets can be reduced, so that the throughput can be increased.

In addition, according to an alignment apparatus of the present invention, effects similar to those obtained by the above-described alignment method of the present invention can also be obtained.

In addition, according to an exposure apparatus of the present invention, alignment can be performed with high accuracy without reducing the throughput in accordance with the configuration accuracy of the marks formed on a substrate.

Further objects, features and advantages of the present invention will become apparent from the following description of the preferred embodiment with reference to the attached drawings.

DESCRIPTION OF THE PREFERRED EMBODIMENT

An alignment method according to a preferred embodiment of the present invention is used for sequentially aligning a plurality of sample shot areas arranged on a substrate in a predetermined configuration to a predetermined reference position. The alignment method includes a first step of sequentially measuring the positions of the sample shot areas on the substrate; a second step of calculating conversion parameters ($S\alpha\theta$), with which the relationship between the measured positions of the sample shot areas and designed positions thereof is expressed, so as to minimize the overall error determined on the basis of residual errors ($e_i$) between corrected positions obtained by using the conversion parameters and the measured positions; a third step of additionally selecting one or more sample shot areas depending on the result obtained at the second step; a fourth step of memorizing the conversion parameters in correspondence with the combinations of the sample shot areas; and a fifth step of determining whether or not to finish the alignment measurement on the basis of the conversion parameters memorized in correspondence with the combinations of the sample shot areas.

In the present embodiment, the position measurement of the alignment targets is performed by measuring the amount of displacement of the alignment targets from the designed positions thereof. In addition, according to the present embodiment, alignment of the overall substrate is performed by selecting a plurality of marks to be measured from a plurality of alignment marks formed on the substrate to be processed and measuring the positions of the selected marks. The alignment is performed with high accuracy without reducing the throughput in accordance with the measurement accuracy of the marks formed on a substrate. For example, according to the present embodiment, global alignment can be performed such that the accuracy is improved by increasing the number of sample shots when a substrate having a low measurement accuracy is used and such that the throughput is increased by reducing the number of sample shots when a substrate having a high measurement accuracy is used.

Next, the embodiment of the present invention will be described in detail below.

Figure 1:
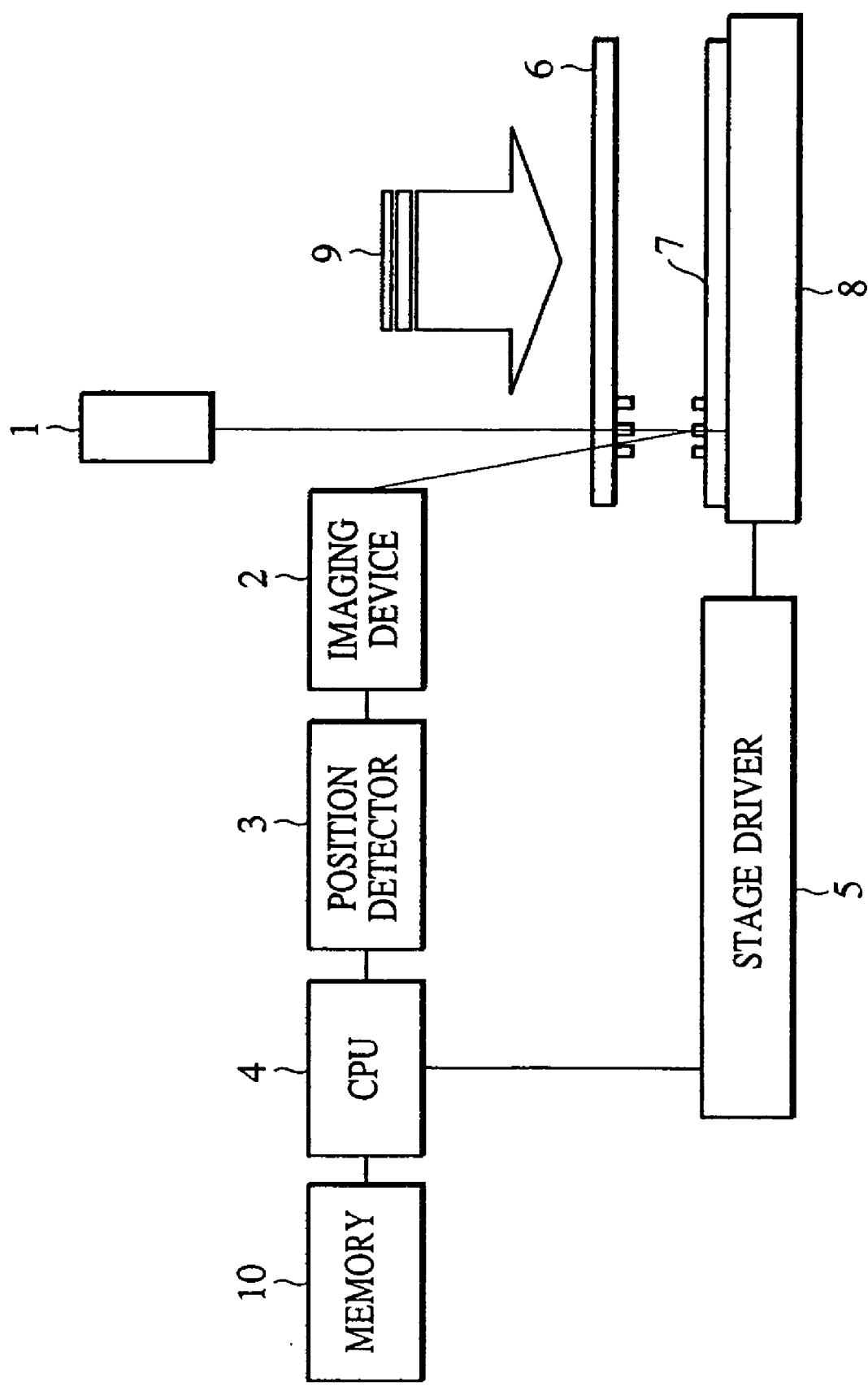
FIG. 1 is a schematic diagram showing an exposure apparatus including an alignment apparatus according to an embodiment of the present invention.
Figure 4:
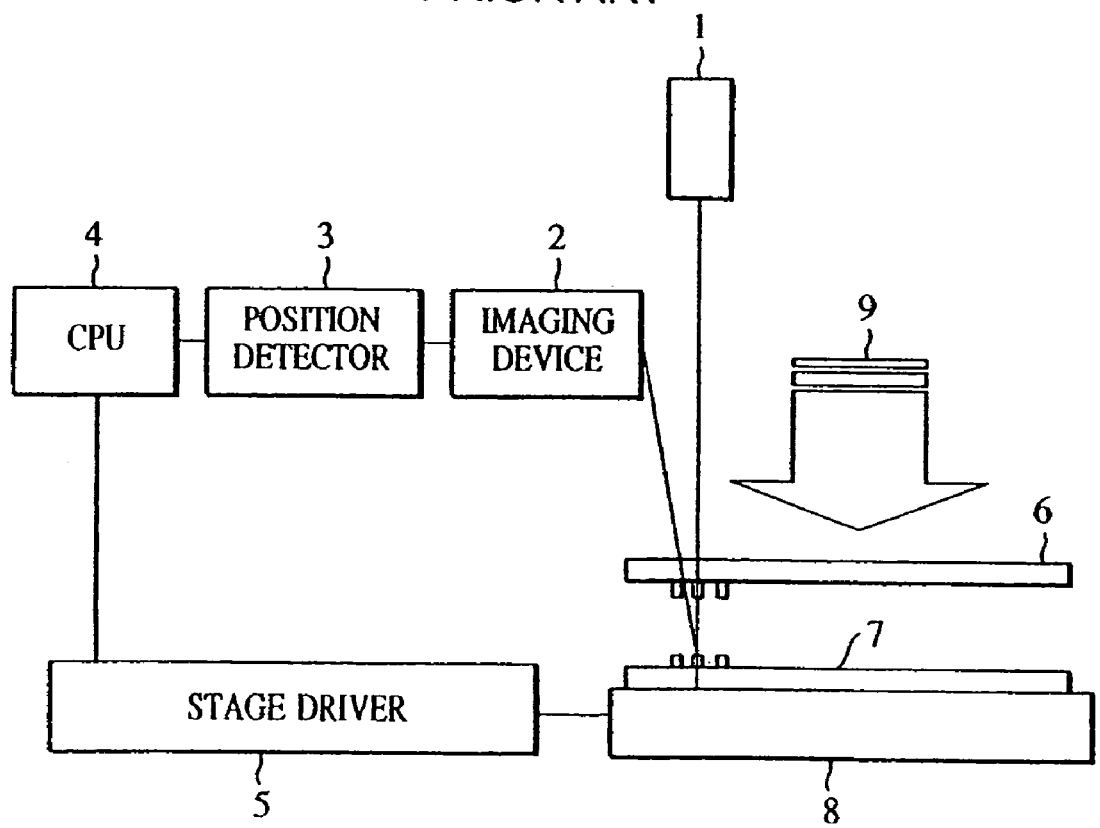
FIG. 4 is a schematic diagram showing a known semiconductor exposure apparatus.

FIG. 1 is a schematic diagram showing an exposure apparatus including an alignment apparatus according to an embodiment of the present invention. The exposure apparatus shown in FIG. 1 has similar features to the known exposure apparatus shown in FIG. 4 and additionally includes a memory 10.

Figure 2:
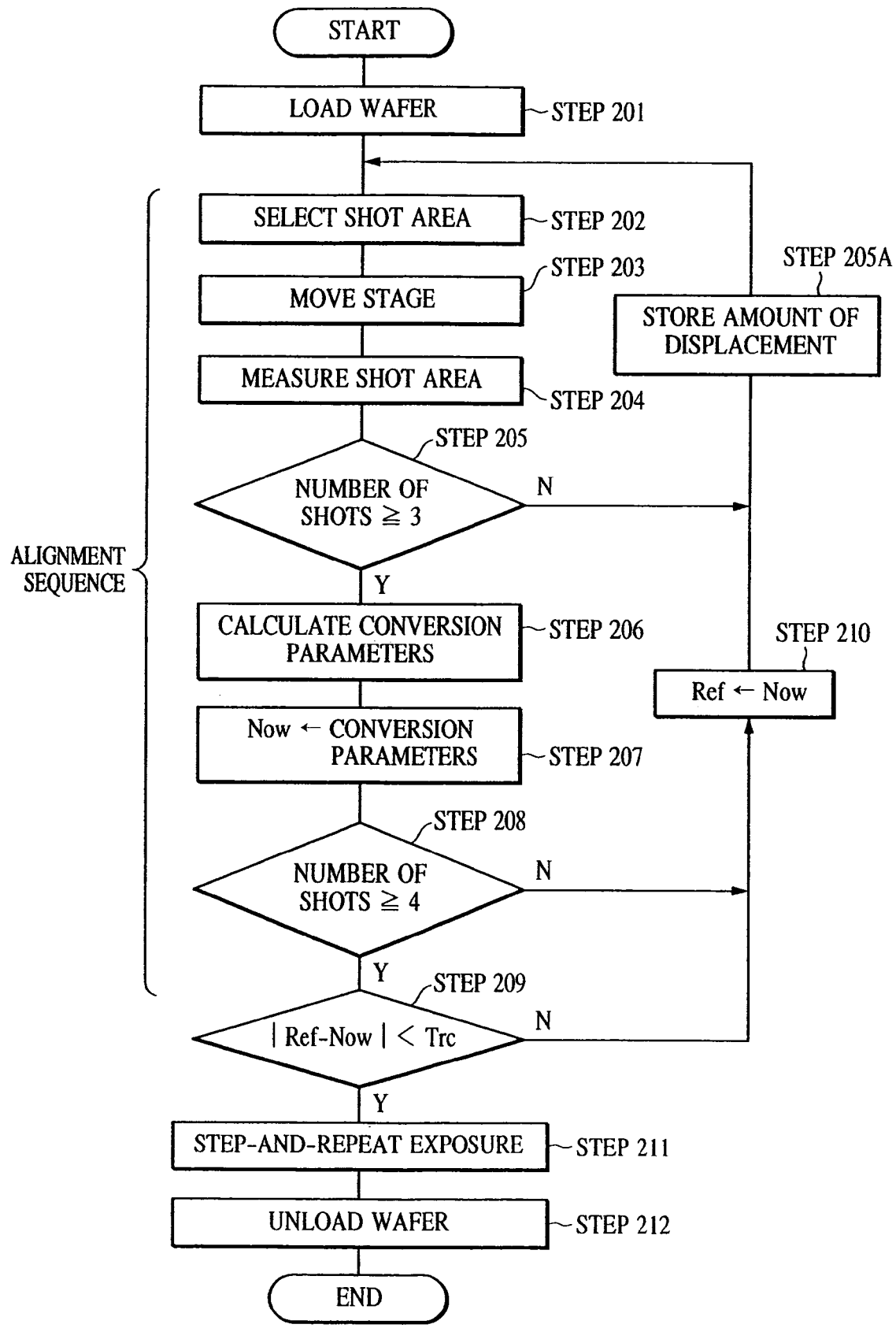
FIG. 2 is a flowchart showing an exposure process performed by the exposure apparatus shown in FIG. 1.
Figure 5:
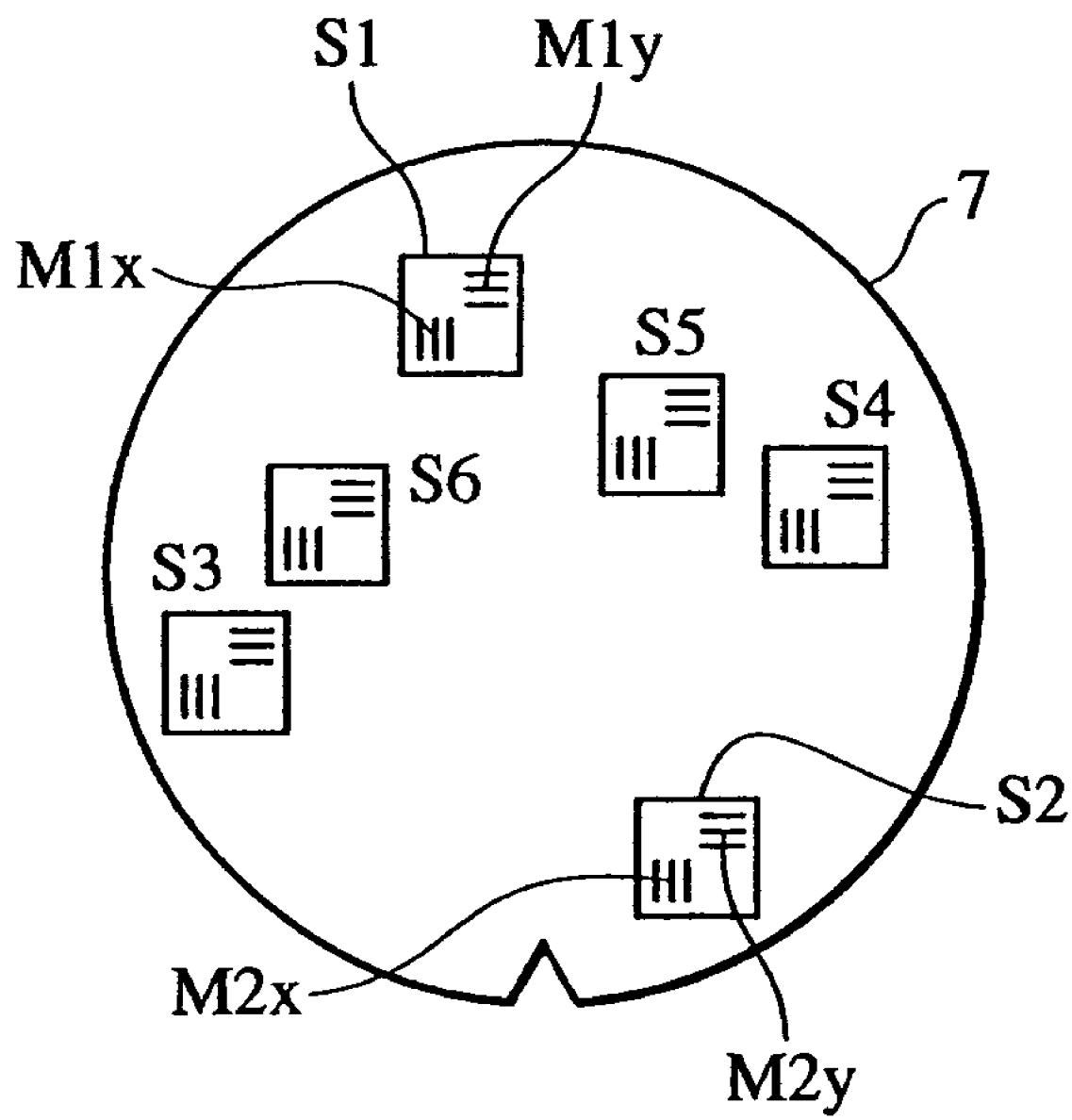
FIG. 5 is a diagram showing shot areas and marks formed on a wafer used in the exposure apparatuses shown in FIGS. 1 and 4.
Figure 6:
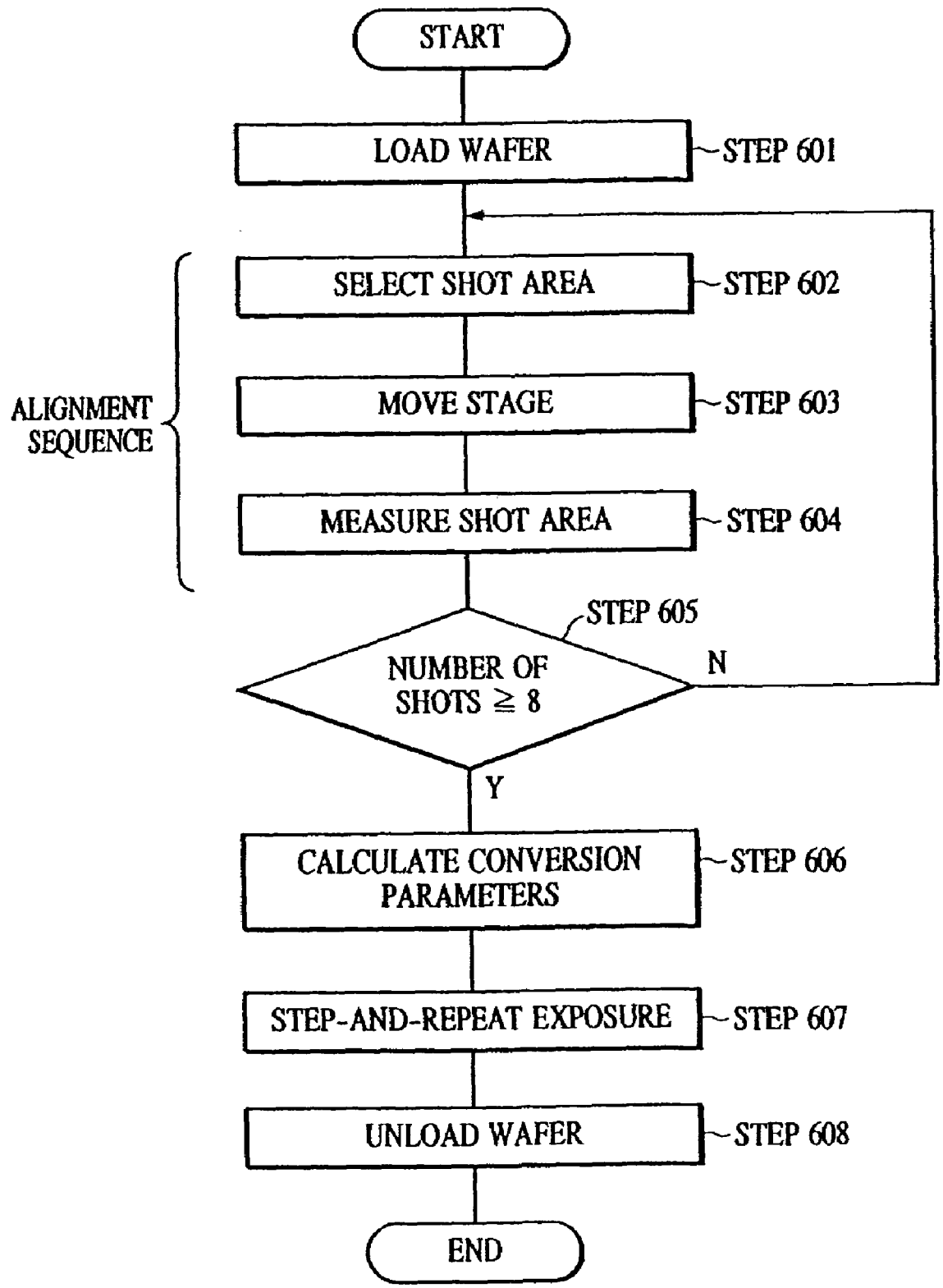
FIG. 6 is a flowchart showing an exposure process performed by the semiconductor exposure apparatus shown in FIG. 4.

FIG. 2 is a flowchart showing an exposure process performed by the exposure apparatus shown in FIG. 1. At Step 201, a wafer 7 is placed on an XY stage 8 by a wafer-conveying device (not shown). Then, at Step 202, a CPU 4 selects one of the sample shot areas on the wafer 7. First, a first shot area S1 is selected from sample shot areas S1 to S6 (see FIG. 5). Then, at Step 203, the CPU 4 outputs a command to a stage driver 5 and moves the XY stage 8 such that an alignment mark M1x in the first shot area S1 (shown in FIG. 5) is moved to a viewable area of the alignment optical system.

Alignment light emitted from the illumination device 1 passes through the mask 6, is reflected by the wafer 7, and illuminates the imaging device 2. The illuminating light that enters the imaging device 2 is transmitted to the position detector (position converter) 3 and is converted into the amount of displacement. In this manner, the measurement for the first shot area is performed at Step 204.

At Step 205, the CPU 4 determines whether or not the number of shots is three or more. If the number of shots is less than three, that is, if the result at Step 205 is No, the amount of displacement is stored in the memory 10 at Step 205A, and measurements for the second shot area S2 and the third shot area S3 are sequentially performed (Steps 202 to 204).

Figure 7:
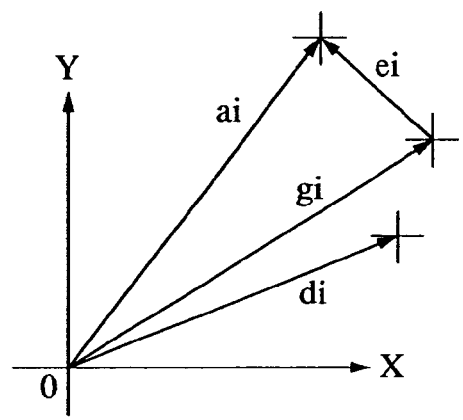
FIG. 7 is a diagram showing a designed mark position, an actual mark position, a corrected mark position obtained by using conversion parameters, and the residual error between the corrected mark position and the actual mark position, in a shot area of the wafer used in the exposure apparatuses shown in FIGS. 1 and 4.
Figure 8:
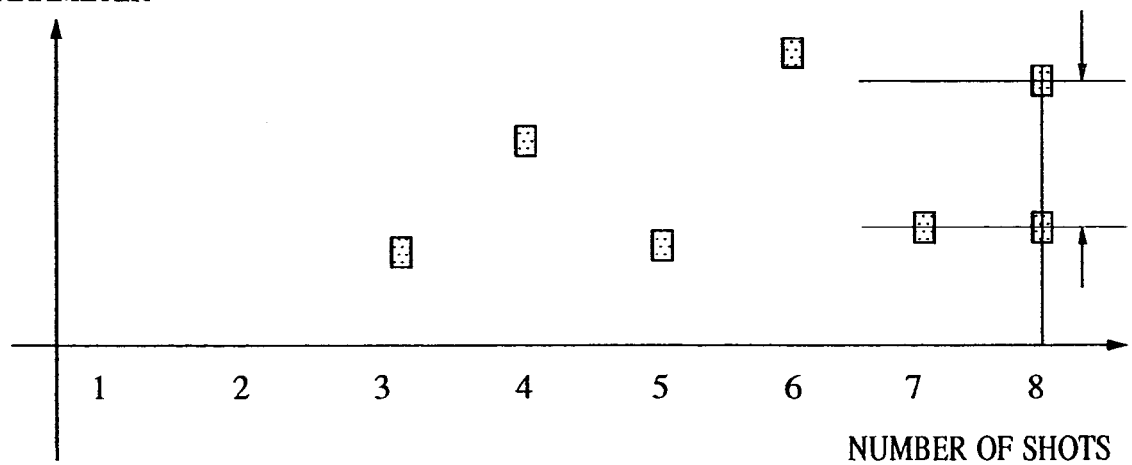
FIG. 8 is a diagram showing an example of the relationship between the number of shots and a conversion parameter according to the known art.
Figure 9:
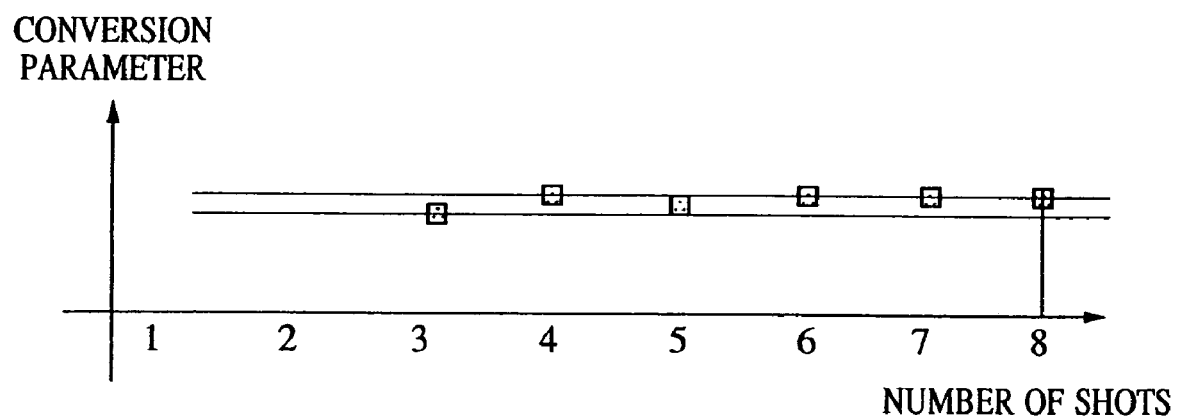
FIG. 9 is a diagram showing another example of the relationship between the number of shots and a conversion parameter according to the known art.

If the number of shots is three or more at Step 205, that is, if the result at Step 205 is Yes, conversion parameters (Sαθ) are calculated at Step 206 by using the data obtained in the three previous shots when the number of shots is three. The conversion parameters are calculated by the method described above with reference to FIG. 7.

A set of the calculated conversion parameters (αx3, αy3, θx3, θy3, Sx3, and Sy3) is denoted by Ref3, and the conversion parameters calculated at Step 206 is stored in a register Now at Step 207.

At Step 208, it is determined whether or not the number of shots is four or more. If the number of shots is less than four, that is, if the result at Step 208 is No, the contents of the register Now (Ref3) are stored in a register Ref at Step 210. The registers Now and Ref are included in the memory 10. Then, the measurement for the fourth shot area is performed (Steps 202 to 204). Since the number of shots is four, the result at Step 205 is Yes, and the process proceeds to Step 206, where the conversion parameters (Sαθ) are calculated by using the data obtained in the four previous shots. A set of the calculated conversion parameters is denoted by Ref4, and is stored in the register Now at Step 207.

Since the number of shots is four, the result at Step 208 is Yes, and the process proceeds to Step 209. At Step 209, the difference between Ref3 stored in the register Ref and Ref4 stored in the register Now is calculated, and it is determined whether or not the difference is less than a predetermined tolerance (Trc). If the difference between Ref3 and Ref4 is less than the predetermined tolerance (Trc), that is, if the result at Step 209 is Yes, it is determined that the accuracy of the conversion parameters is sufficient, and the alignment sequence is finished.

In the present embodiment, the tolerance (Trc) is a set of elements expressed as (αxtrc, αytrc, θxtrc, θytrc, Sxtrc, and Sytrc).

More specifically, the alignment sequence is finished at Step 209 when all of |αx4−αx3|<αxtrc, |αy4−αy3|<αytrc, |θx4−θx3|<θxtrc, |θy4−θy3|<θytrc, |Sx4−Sx3|<Sxtrc, and |Sy4−Sy3|<Sytrc are satisfied.

When the difference between Ref3 and Ref4 is greater than the predetermined tolerance (Trc), that is, if the result at Step 209 is No, it is determined that the accuracy of the conversion parameters is not sufficient yet, and the contents of the register Ref are replaced by the contents of the register Now at Step 210, and the measurement for the next shot area (fifth shot area) is performed (Steps starting from Step 202).

Accordingly, Ref5 is obtained by the end of the measurement for the fifth shot area. Then, at Step 209, the difference between Ref4 and Ref5 is calculated, and it is determined whether or not the difference is less than the tolerance (Trc).

Figure 3:
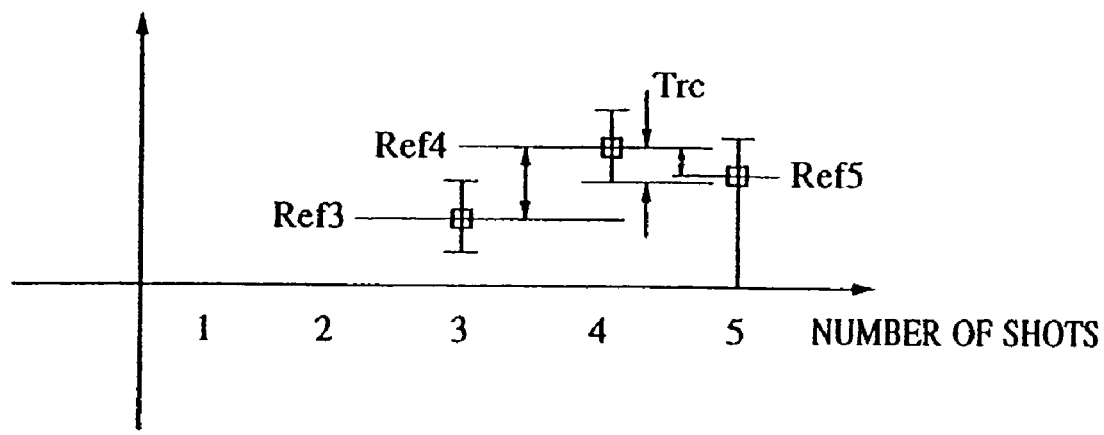
FIG. 3 is a diagram showing an example in which sufficiently accurate conversion parameters are obtained with a small number of shots by using the process shown in FIG. 2.

FIG. 3 is a diagram showing an example in which sufficiently accurate conversion parameters are obtained with a small number of shots by using the process shown in FIG. 2. In FIG. 3, the vertical axis shows the conversion parameter and the horizontal axis shows the number of shots. For simplification, a case in which the difference between Ref4 and Ref5 is less than the tolerance (Trc) is shown in FIG. 3.

If the alignment sequence is finished at Step 209 in FIG. 2, that is, if the result at Step 209 is Yes, step-and-repeat exposure is performed at Step 211. Lastly, the wafer is unloaded at Step 212, and the exposure sequence is finished.

In FIG. 2, Ref4, Ref5, . . . , are simply shown as Ref. As used in the present embodiment, the number following "Ref" represents the number of shots at that time.

As described above, according to the present embodiment, the conversion parameters are calculated each time the measurement for a shot area is performed, while the number of shots is increased, and the alignment sequence is repeated until the conversion parameters converge.

According to the present embodiment, the conversion parameters can be determined with the same accuracy for both a wafer having a large measurement error and a wafer having a small measurement error. Therefore, the alignment accuracy can be improved.

In addition, in the case in which a wafer having a small measurement error is used, the number of sample shots can be reduced, so that the throughput can be increased.

Next, processes for manufacturing a device using an exposure apparatus according to the present invention will be described below.

Figure 10:
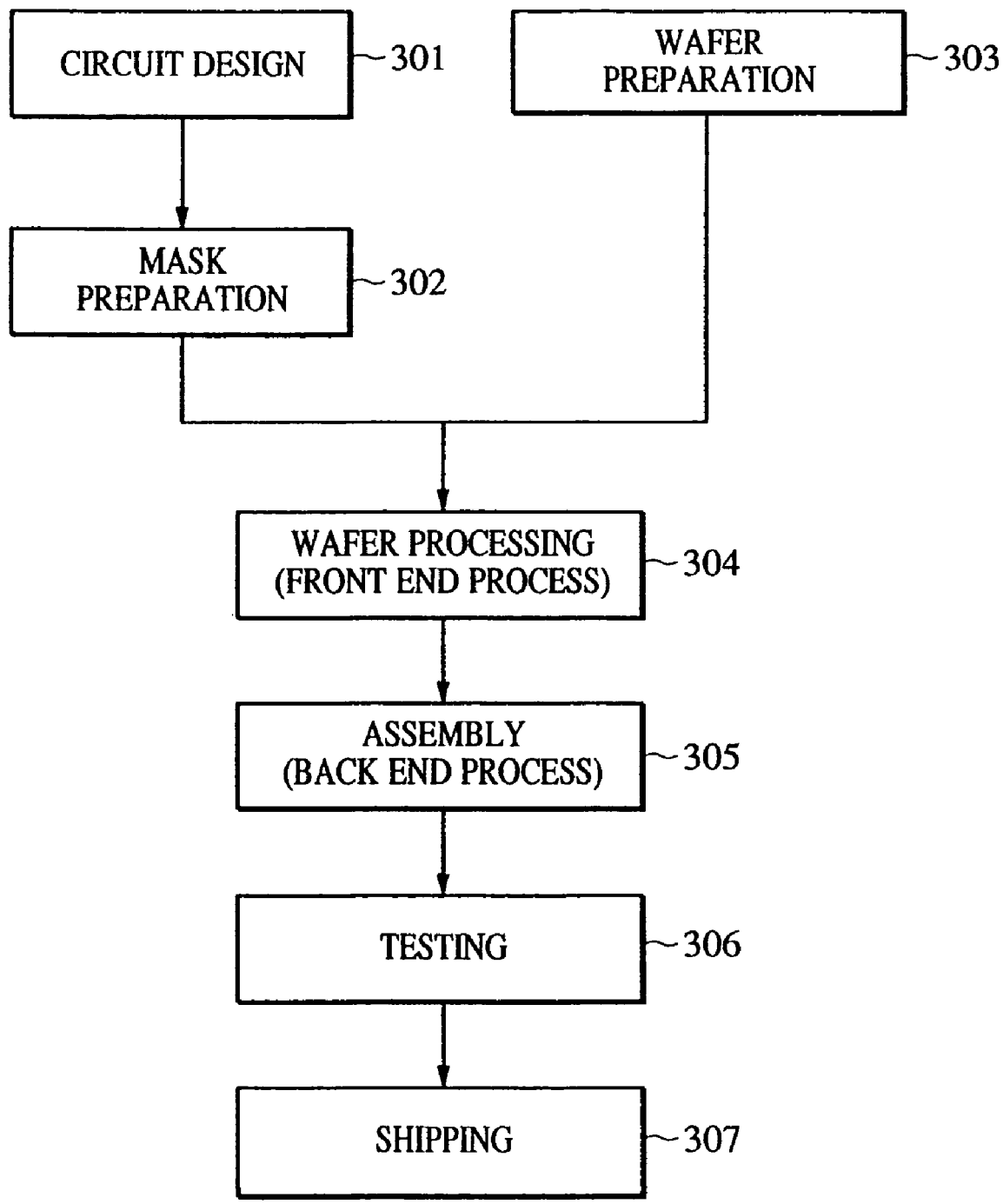
FIG. 10 is a flowchart showing processes for manufacturing a small device.

FIG. 10 is a flowchart showing processes for manufacturing a small device (e.g., a semiconductor chip such as an IC and an LSI, a liquid crystal panel, a CCD, a thin-film magnetic head, a micromachine, etc.). In step 301 (circuit design), circuits of a semiconductor device are designed. In step 302 (mask preparation), a mask in which the designed circuit pattern is formed is manufactured. In step 303 (wafer preparation), a wafer is manufactured from, for example, silicon. Step 304 (wafer processing) is known as a front-end process, and actual circuits are formed on the wafer by a lithographic technique using the above-described mask and wafer. Step 305 (assembly) is known as a back-end process, and semiconductor chips are formed by using the wafer processed at Step 304. Step 305 includes assembly processes (dicing and bonding), packaging processes (enclosing of the chips), etc. In Step 306 (testing), various tests including operation tests, durability tests, etc., of the semiconductor device formed at Step 305 are performed. Accordingly, the semiconductor device is completed, and is then shipped (Step 307).

Figure 11:
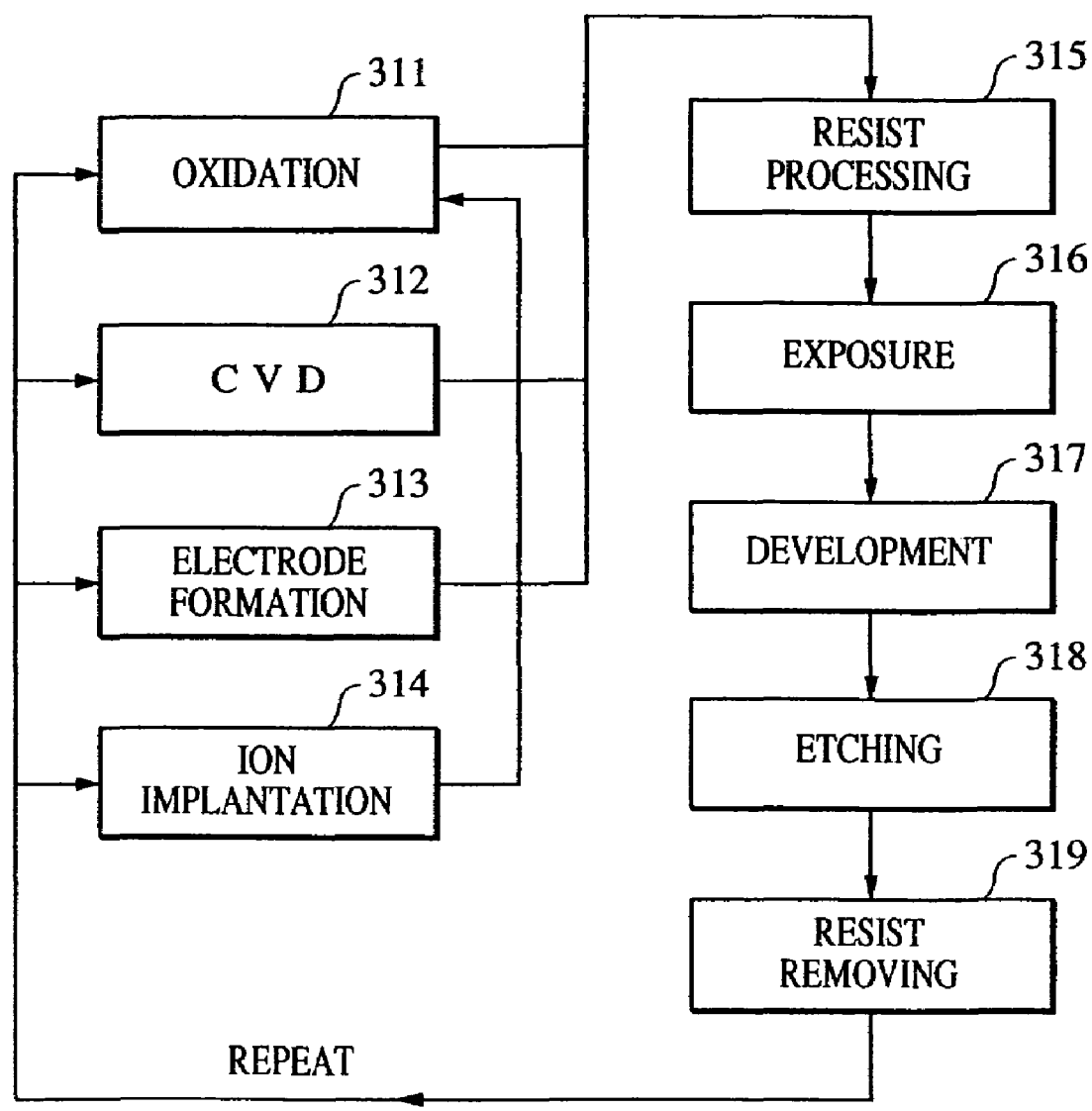
FIG. 11 is a flowchart of a wafer process shown in FIG. 10.

FIG. 11 is a flowchart showing the above-described wafer process (Step 304) in detail. In Step 311 (oxidation), the surface of the wafer is oxidized. In Step 312 (CVD), an insulating layer is formed on the surface of the wafer using, for example, chemical vapor deposition. In Step 313 (electrode formation), electrodes are formed on the wafer by vapor deposition. In Step 314 (ion implantation), ions are implanted in the wafer. In Step 315 (resist processing), a photosensitive material is applied on the wafer. In Step 316 (exposure), exposure of the wafer is performed by the above-described exposure apparatus, so that the circuit pattern is formed on the mask. In Step 317 (development), the exposed wafer is developed. In Step 318 (etching), parts which are not covered by the resist are etched. In Step 319 (resist removing), the resist, which is not necessary after the etching, is removed. By repeating the above-described steps, a circuit pattern having multiple levels is formed. A highly-integrated semiconductor device, which has been difficult to manufacture in the known art, can be manufactured by applying the alignment method of the present embodiment.

Except as otherwise discussed herein, the various components shown in outline or in block form in the Figures are individually well known and their internal construction and operation are not critical either to the making or using or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An apparatus for determining positions of a plurality of regions formed on a substrate based on positions of a plurality of sample regions sampled from the plurality of regions, said apparatus comprising:

stage configured to hold and move the substrate;

an alignment optical system configured to measure a position of each of the plurality of the sample regions sampled from the plurality of regions on the substrate held and moved by said stage; and a processor configured to control operation of said stage and said alignment optical system so as to obtain positions of the plurality of the sample regions sampled from the plurality of regions, to calculate a first conversion parameter for converting designed positions of the plurality of regions into first determined positions of the plurality of regions based on designed positions of the plurality of the sample regions and positions of the plurality of the sample regions measured by said alignment optical system, to control operation of said stage and said alignment optical system so as to obtain a position of an additional sample region sampled from the plurality of regions to increase the plurality of the sample regions, to calculate a second conversion parameter for converting designed positions of the plurality of regions into second determined positions of the plurality of regions based on designed positions of the increased plurality of the sample regions and positions of the increased plurality of the sample regions measured by said alignment optical system, and to determine whether to finish the position determinations based on a difference between the first conversion parameter and the second conversion parameter.

2. An apparatus according to claim 1, wherein said processor is configured to calculate the first conversion parameter so as to minimize errors between the measured positions of the plurality of the sample regions and positions of the plurality of the sample regions determined by using the first conversion parameter.

3. An apparatus according to claim 1, wherein said processor is configured to calculate the second conversion parameter so as to minimize errors between the measured positions of the increased plurality of the sample regions and positions of the increased plurality of the sample regions determined by using the second conversion parameter.

4. An apparatus according to claim 1, wherein said processor is configured to determine to finish the position determinations if the difference is within a tolerance.

5. An apparatus according to claim 1, wherein if said processor determines not to finish the position determinations, then said processor is configured to replace a value of the first conversion parameter by a value of the second conversion parameter.

6. An apparatus according to claim 1, wherein said alignment optical system is configured to measure a position of a mark formed with respect to each of the plurality of the sample regions.

7. An exposure apparatus for exposing each of a plurality of regions on a substrate to light via an original, said apparatus comprising:

an apparatus as defined in claim 1 for determining positions of the plurality of regions on the substrate based on positions of a plurality of the sample regions sampled from the plurality of regions.

8. A method of manufacturing a device, said method comprising steps of:

exposing each of a plurality of regions on a substrate to light via an original using an exposure apparatus as defined in claim 7;

developing the exposed substrate; and processing the developed substrate to manufacture the device.

* * * * *